(12) United States Patent
Jones, Jr. et al.

(10) Patent No.: US 6,643,212 B1
(45) Date of Patent: Nov. 4, 2003

(54) SIMULTANEOUS FUNCTION DYNAMIC RANDOM ACCESS MEMORY DEVICE TECHNIQUE

(75) Inventors: Oscar Frederick Jones, Jr., Colorado Springs, CO (US); Michael C. Parris, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/125,758

(22) Filed: Apr. 18, 2002

(51) Int. Cl.$^7$ .................................................. G11C 8/00
(52) U.S. Cl. .............................. 365/230.03; 365/189.04
(58) Field of Search ........................ 365/230.03, 189.04, 365/185.11

(56) References Cited

U.S. PATENT DOCUMENTS 5,636,173 A * 6/1997 Schaefer ................. 365/230.03
5,996,052 A   11/1999 Taniguchi et al. ........... 711/155

OTHER PUBLICATIONS

Hardee, Kim; Jones, O. Fred; Parris, Michael; Butler, Doug; Aldrich, Larry; Austin, Penny; Jacobsen, Ken; Miyabayashi, Masayuki; Taniguchi, Kazuo; Arakama, Tomofumi, A 1.43 GHz Per Data I/O 16Mb DDR Low–Power Embedded DRAM Macro For A 3D Graphics Engine, 2001 IEEE International Solid–State Circuits Conference, 2001 IEEE, pp. 386–387.

Hardee, Kim; Jones, O. Fred; Parris, Michael; Butler, Doug; Aldrich, Larry; Austin, Penny; Jacobsen, Ken; Miyabayashi, Masayuki; Taniguchi, Kazuo; Arakama, Tomofumi, A 1.43 GHz Per Data I/O 16 Mb DDR Low–Power Embedded DRAM Macro For A 3D Graphic Engine, ISSCC 2001 Visuals Supplement, © IEEE, pp. 316–317.

* cited by examiner

*Primary Examiner*—Tan T. Nguyen
(74) *Attorney, Agent, or Firm*—William J. Kubida; Peter J. Meza; Hogan & Hartson LLP

(57) ABSTRACT

A simultaneous function dynamic random access memory ("DRAM") technique of particular applicability to DRAMs, synchronous DRAMs ("SDRAM"), specialty DRAMs, embedded DRAMs, embedded SDRAMs and the like which enables the execution of "read", "write", "active" and "precharge" commands on a single clock cycle. The technique of the present invention is of especial applicability to embedded memory arrays or specialty DRAMs where the number of input signals to the DRAM are not necessarily limited by mechanical component packaging constraints or component pin counts. In general, the advantages of the technique are obtained through the use of separate address fields, including bank addresses, for "read" and "write" commands, and separate bank addresses for "active" and "precharge" commands with a resultant highly parallel operational functionality.

26 Claims, 4 Drawing Sheets

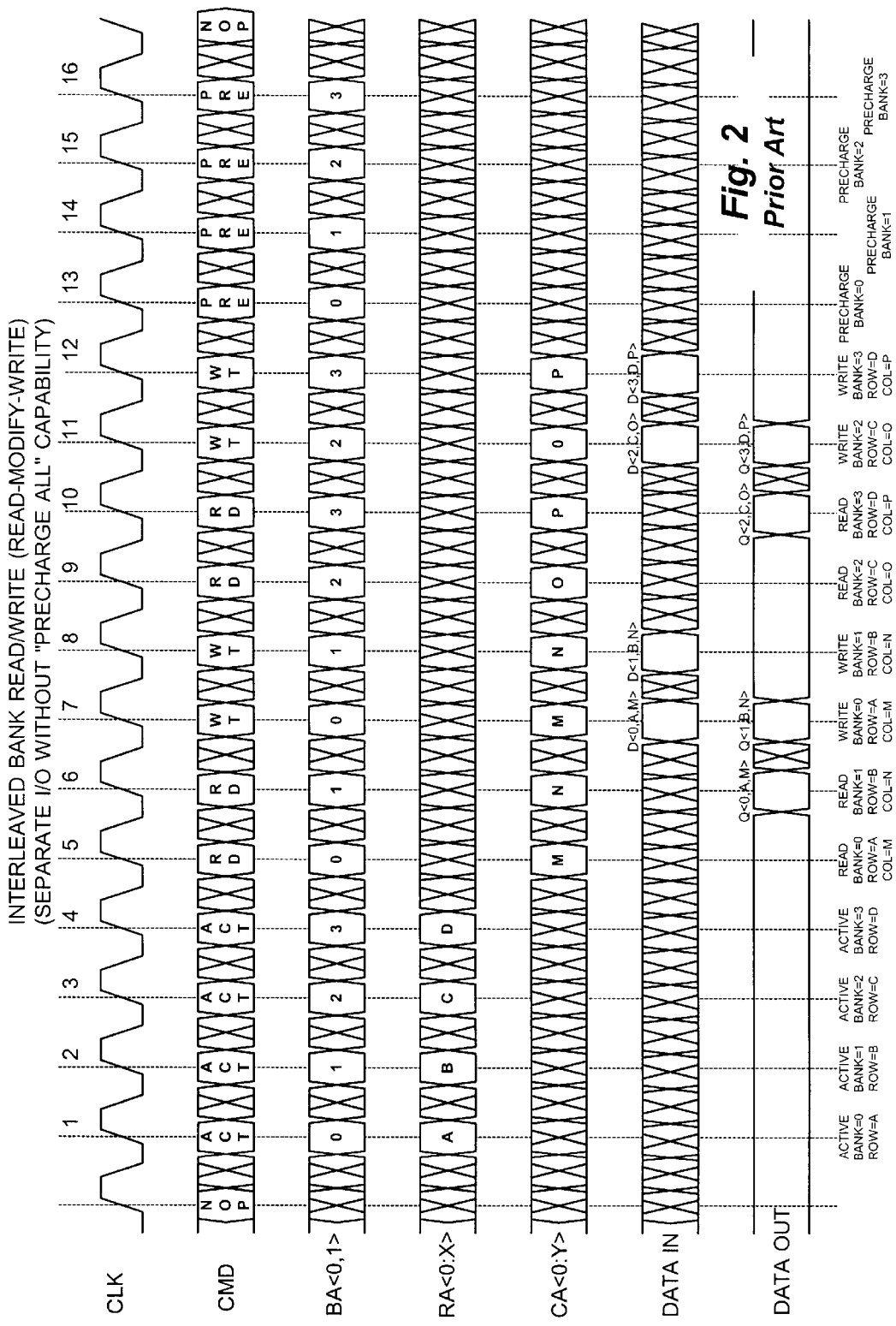

SIMULTANEOUS FUNCTION DYNAMIC RANDOM ACCESS MEMORY DEVICE TECHNIQUE

BACKGROUND OF THE INVENTION

The present invention relates, in general, to the field of integrated circuit ("IC") memory devices and other ICs incorporating embedded memory. More particularly, the present invention relates to a simultaneous function dynamic random access memory ("DRAM") technique of particular applicability to DRAMs, synchronous DRAMs ("SDRAM"), specialty DRAMs, embedded DRAMs, embedded SDRAMs and the like.

It has long been a goal of memory design to increase the performance of DRAM in order to support higher speed processors. One method of increasing DRAM performance is to increase the "read" and "write" data rate across the memory bus. SDRAM access times and burst data rates are constantly improving by manufacturing process "shrinks" and improved interconnect technology. Additionally, improved command bus utilization has been achieved by reducing the number of instructions needed to perform certain memory operations. In general, the fewer command cycles which are required for the execution of memory commands results in more bus cycles which are then available for memory data transfers.

To date, several approaches have been used to minimize the number of command cycles needed to access SDRAM devices and embedded arrays. One example is the use of "burst accesses" which utilize a single "read" or "write" command execution in order to read or write to multiple sequential words. Another technique for reducing the number of command cycles required to access SDRAMs is the use of an "auto-precharge" mode of operation. Auto-precharge is a programmable mode wherein a "precharge" operation automatically occurs at the end of a predetermined number of burst "read" or "write" cycles without requiring the assertion of an external "precharge" command. Similarly, the execution of a "refresh" command in SDRAMs results in the device automatically precharging at the end of the "refresh" operation.

Nevertheless, there are a number of applications, such as in conjunction with graphics processors, where performance could be greatly enhanced if the associated memory supported multiple command executions on a single clock cycle. As an example, a memory architecture that allows for simultaneous "read" and "write" operations (used primarily for read-modify-write cycles) may use a "write" address first-in, first-out ("FIFO") register to capture a "read" address to be used later as a "write" address. See Hardee, K. et al.; "A 1.43 GHz Per Data I/O 16 Mb DDR Low-Power Embedded DRAM Macro for a 3D Graphics Engine"; 2001 IEEE International Solid-State Circuits Conference Digest of Technical Papers; pp 386–387 and ISSCC Visuals Supplement pp 316–317. Further, the concept of capturing the "read" address and using it at a later time via a pipeline is described in U.S. Pat. No. 5,996,052 issued Nov. 30, 1999 to Taniguchi et al. for: "Method and Circuit for Enabling a Clock-Synchronized Read-Modify-Write Operation on a Memory Array".

While simultaneous "read" and "write" operations have been reported in specialty memories (and certain embedded memories) using posted "write" addresses as mentioned above, simultaneous "read", "write", "active" and "precharge" operations in response to external memory commands have apparently not been previously reported.

SUMMARY OF THE INVENTION

In this regard, the technique of the present invention advantageously enables the execution of "read", "write", "active" and "precharge" commands to a memory array on a single clock cycle. The technique disclosed herein is of especial applicability to embedded memory arrays or specialty DRAMs where the number of input signals to the DRAM are not necessarily limited by mechanical component packaging constraints or component pin counts. In general, the present invention provides for the use of separate address fields, including bank addresses, for "read" and "write" commands, and separate bank addresses for "active" and "precharge" commands with a resultant highly parallel operational functionality.

In accordance with the disclosure of the present invention, simultaneous commands are supported through the use of separate bank addresses. As a consequence, parallel "active", "read", "write" and "precharge" commands can be executed on the same clock ("CLK") cycle with only simultaneous "active" and "precharge" commands being unable to be executed to the same bank during any given clock cycle.

In a particular representative embodiment disclosed herein, each "active", "read", "write" and "precharge" command has its own dedicated address field, including bank addresses. In this manner, each command can be simultaneously and independently executed during the same clock cycle resulting in much improved memory control bus utilization through this high level of parallel operation.

Through the use of separate "read" and "write" addresses together with separate bank addresses for "precharge" operations as well, multiple commands may be captured on one edge (e.g. the rising edge) of the clock signal and performed internally to the memory array in parallel. For example, in a conventional four bank memory the address fields are: BA<0,1> (bank address); RA<0:X> (row address) and CA<0:X> (column address). By contrast, and in accordance with the technique of the present invention, the following new address fields may be utilized: BAA<0,1> (bank address for "active" or row select); BAR<0,1> (bank address for "read" commands); BAW<0,1> (bank address for "write" commands); BAP<0,1> (bank address for "precharge"); RA<0:X> (row address); CAR<0:X> (column address for "read" commands) and CAW<0:X> (column address for "write" commands).

In this regard, the conventional row address strobe ("/RAS"); column address strobe ("/CAS"); write enable ("/WE") and chip select ("/CE") signals may be then replaced with "read", "write", "active" and "precharge" commands with the input/outputs ("I/Os"; "DATA IN" and "DATA OUT") not being common. Used together with the aforementioned address commands, fully parallel memory operation results. While this internally parallel operation adds some extra address bussing over prior art techniques and results in a small increase in DRAM periphery area, it nevertheless allows for a two, three or four (or more) times increase in memory bandwidth.

Particularly disclosed herein is an integrated circuit device including a memory array comprising a plurality of memory banks and wherein the memory array receives a clock signal and a number of memory array command signals and is configured for reading data therefrom and writing data thereto. The memory array comprises: a row address input for specifying a row address within the memory array; at least one column address input for specifying a column address within the memory array; a bank address read input for specifying one of the memory banks from which data may be read at the specified row and column address; and a bank address write input for substantially concurrently specifying another one of the memory banks to which data may be written at the specified row and column address.

Also disclosed herein is an integrated circuit device including a memory array comprising a plurality of memory banks. The integrated circuit device comprises: a clock input for sequencing operations of said memory array; a command input for receiving at least read, write, active and precharge commands for the memory array; a row address input for specifying a row address within the memory array; first and second column address inputs for specifying independent column addresses for respectively reading data from and writing data to the memory array; and a plurality of bank address inputs, with each of the bank address inputs corresponding to one of the read, write, active and precharge commands.

Further disclosed herein is a method for accessing data in an integrated circuit device including a memory array comprising a plurality of memory banks. The method comprises the steps of: activating a first of the plurality of memory banks on a first clock cycle and activating a second of the plurality of memory banks while substantially concurrently reading data from the first of said plurality of memory banks on a second clock cycle.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 2 is a representative timing diagram illustrative of the interrelationship among the clock ("CLK"), command ("CMD"), bank address ("BA<0,1>"), row address ("RA<0:1>"), column address ("CA<0:1>"), DATA IN and DATA OUT signals in a prior art integrated circuit device similar to that shown in the preceding figure and wherein the device does not include a "precharge all" capability;

DESCRIPTION OF A REPRESENTATIVE EMBODIMENT

Figure 1:
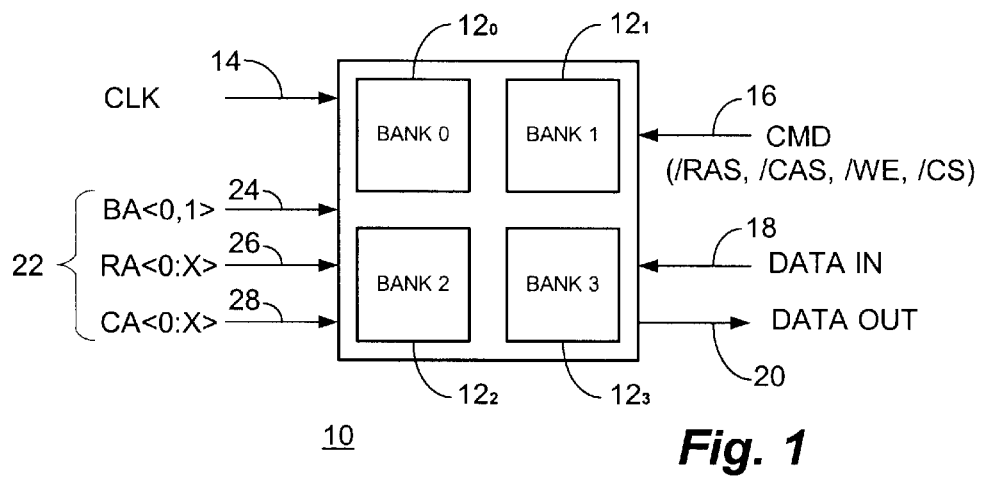
FIG. 1 is a simplified functional block diagram of a prior art integrated circuit device incorporating an embedded memory array having, for example, four banks of memory accessible through conventional address fields for the bank, row and column addresses.

With reference now to FIG. 1, a simplified functional block diagram of a prior art integrated circuit device 10 is shown incorporating an embedded memory array. The memory array comprises, for example, four memory banks $12_0$ through $12_3$ (Bank 0 through Bank 3 respectively). A clock signal ("CLK") is supplied to the device 10 to synchronize memory accesses and a number of commands may be provided on various inputs shown as a single line 16 which, in a conventional DRAM or SDRAM device 10 can include an active low row address strobe ("/RAS"), column address strobe ("/CAS"), write enable ("/WE"), chip select ("/CS") signals and the like. Data to be written to the memory banks $12_0$ through $12_3$ may be input in serial or parallel format as shown by line 18 while data read from the device 10 may likewise be output as indicated by line 20.

In general, the memory banks $12_0$ through $12_3$ are accessible through conventional address fields for the bank, row and column addresses which, in the simplified embodiment of the device 10 shown may comprise bank address field BA<0,1> on line 24, row address field RA<0:1> on line 26 and column address field CA<0:1> on line 28.

With reference additionally now to FIG. 2, a representative timing diagram illustrative of the interrelationship among CLK, command ("CMD"), bank address ("BA<0, 1>"), row address ("RA<0:1>"), column address ("CA<0:1>"), DATA IN and DATA OUT signals is shown, for example, in a prior art integrated circuit device similar to that shown in the preceding figure. In this example, the device does not include a "precharge all" capability and the commands illustrated are: "active" ("ACT"), "read" ("RD"), "write" ("WT") and "precharge" ("PRE").

The bank address field BA<0,1> in this four memory bank example can have any one of four values representative of the corresponding memory banks $12_0$ through $12_3$. The row address field RA<0:X> is illustrated as having four values: A, B, C and D while the column address field CA<0:X> also has four values: M, N, 0 and P.

On the positive transition of CLK pulse "1", bank 0, row A is made "active" followed by bank 1, row B at CLK pulse "2", bank 2, row C at CLK pulse "3" and bank 2, row D at CLK pulse "4". A "read" command is issued at CLK pulse 5 to bank 0 and column M of the already active row A followed by another "read" command at CLK pulse 6 to bank 1, column N of the active row B. The data output ("Q") for bank 0, row A, column M appears at the DATA OUT line coincident with the sixth CLK pulse while the data output for bank 1, row B, column N appears on the following CLK pulse 7.

Also at CLK pulse 7, a "write" command is issued to bank 0, row A and column M followed by another "write" to bank 1, row B, column N at CLK pulse 8. At CLK pulse 9, a "read" operation is directed to bank 2, row C, column 0 followed by another "read" command to bank 3, row D, column P at CLK pulse 10. The data output ("Q") for bank 2, row C, column 0 appears at the DATA OUT line coincident with the tenth CLK pulse while the data output for bank 3, row D, column P appears on the following CLK pulse 11.

Also at CLK pulse 11, another "write" command is issued to bank 2, row C and column O followed by another "write" to bank 3, row D, column P at CLK pulse 12. Thereafter, at CLK pulse 13, a PRECHARGE command is issued to bank 0, followed by separate PRECHARGE commands issued to banks 1, 2 and 3 at CLK pulses 14, 15 and 16 respectively. As can be determined, the interleaved bank read/write (read-modify-write) operation without a "precharge all" capability requires a full sixteen CLK cycles to complete resulting in an undesirably lengthy utilization of the device memory control bus.

Figure 3:
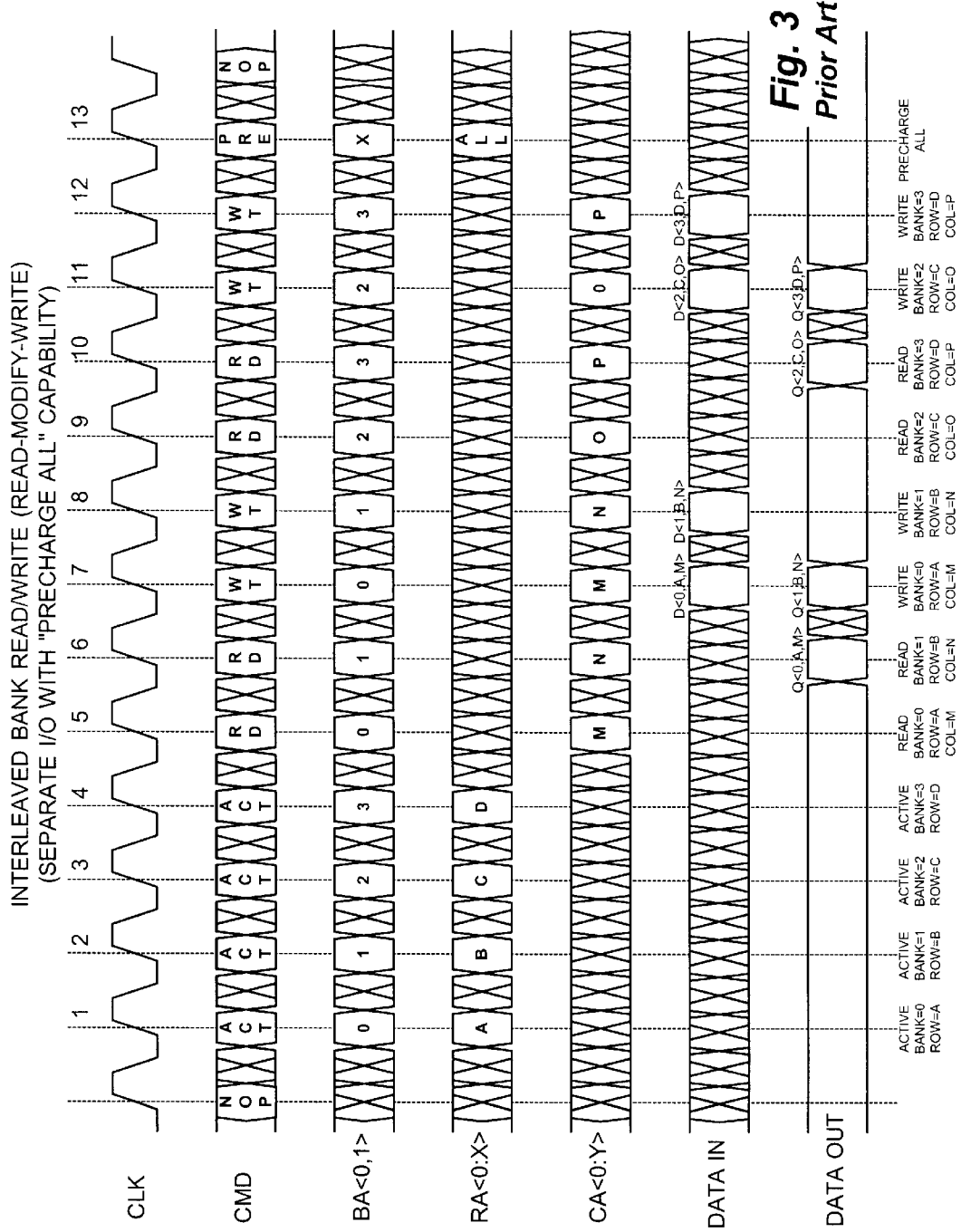
FIG. 3 is a further representative timing diagram illustrative of the interrelationship among the CLK, CMD, BA<0, 1>, RA<0:X>, CA<0:X>, DATA IN and DATA OUT signals in a prior art integrated circuit device similar to that shown in FIG. 1 and wherein the device does include a "precharge all" capability.

With reference additionally now to FIG. 3, a further representative timing diagram illustrative of the interrelationship among the conventional CLK, CMD, BA<0,1>, RA<0:X>, CA<0:X>, DATA IN and DATA OUT signals is shown in a prior art integrated circuit device similar to that shown in FIG. 1. The functionality illustrated is substantially the same as that previously illustrated and described with respect to the timing diagram for an interleaved bank read/write (read-modify-write) operation of FIG. 2, but in this instance, the device does include a "precharge all" capability. Consequently, the relationship between the CLK, CMD and bank, row and column address fields is the same from CLK pulse 1 through CLK pulse 12. Because a "precharge all" capability is present, at CLK pulse 13, all four banks are precharged concurrently. In this illustrative example, the interleaved bank read/write (read-modify-write) operation including a "precharge all" capability requires thirteen CLK cycles to complete, which, while requiring less device memory control bus utilization than the example of the preceding figure is still undesirably long.

Figure 4:
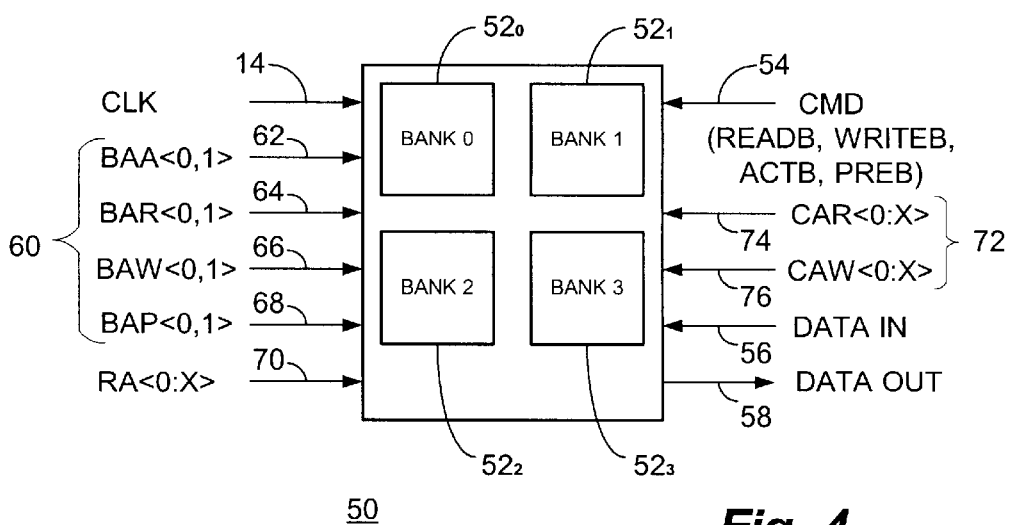
FIG. 4 is a simplified functional block diagram of an exemplary integrated circuit device incorporating an embedded memory array accessible in accordance with the present invention having, for example, four banks of memory and including separate bank addresses for active ("ACTB") (or row select), read ("READB"), write ("WRITEB") and precharge ("PREB") commands as well as row address ("RA<0:X>"), and column address fields for "read" and "write" command ("CAR<0:X>" and "CAW<0:X>")

With reference additionally now to FIG. 4, a simplified functional block diagram of an exemplary integrated circuit device 50 in accordance with the present invention is shown. The device 50 includes an embedded memory array comprising, for example, four memory banks 520 through 523 inclusive (Bank 0 through Bank 3). A clock signal ("CLK") is supplied to the device 50 to synchronize memory accesses and a number of commands may be provided on various inputs shown as a single line 54 including active "low": "active" ("ACTB") (or row select), "read" ("READB"), "write" ("WRITEB") and "precharge" ("PREB") commands. Data to be written to the memory banks 520 through 523 may be input in serial or parallel format as shown by line 56 while data read from the device 50 may likewise be output as indicated by line 58.

A number of novel bank address fields 60 are supplied to enable access operations to the device 50 including, for example, the bank address for active (or row select) commands ("BAA<0,1>") on line 62, the bank address for "read" commands ("BAR<0,1>") on line 64, the bank address for "write" commands ("BAW<0,1>") on line 66 and the bank address for precharge commands ("BAP<0,1>") on line 68. A row address ("RA<0:X>") is supplied on line 70 while a pair of column address fields 72 are furnished for "read" and "write" commands ("CAR<0:X>" and "CAW<0:X>") on lines 74 and 76 respectively.

Figure 5:
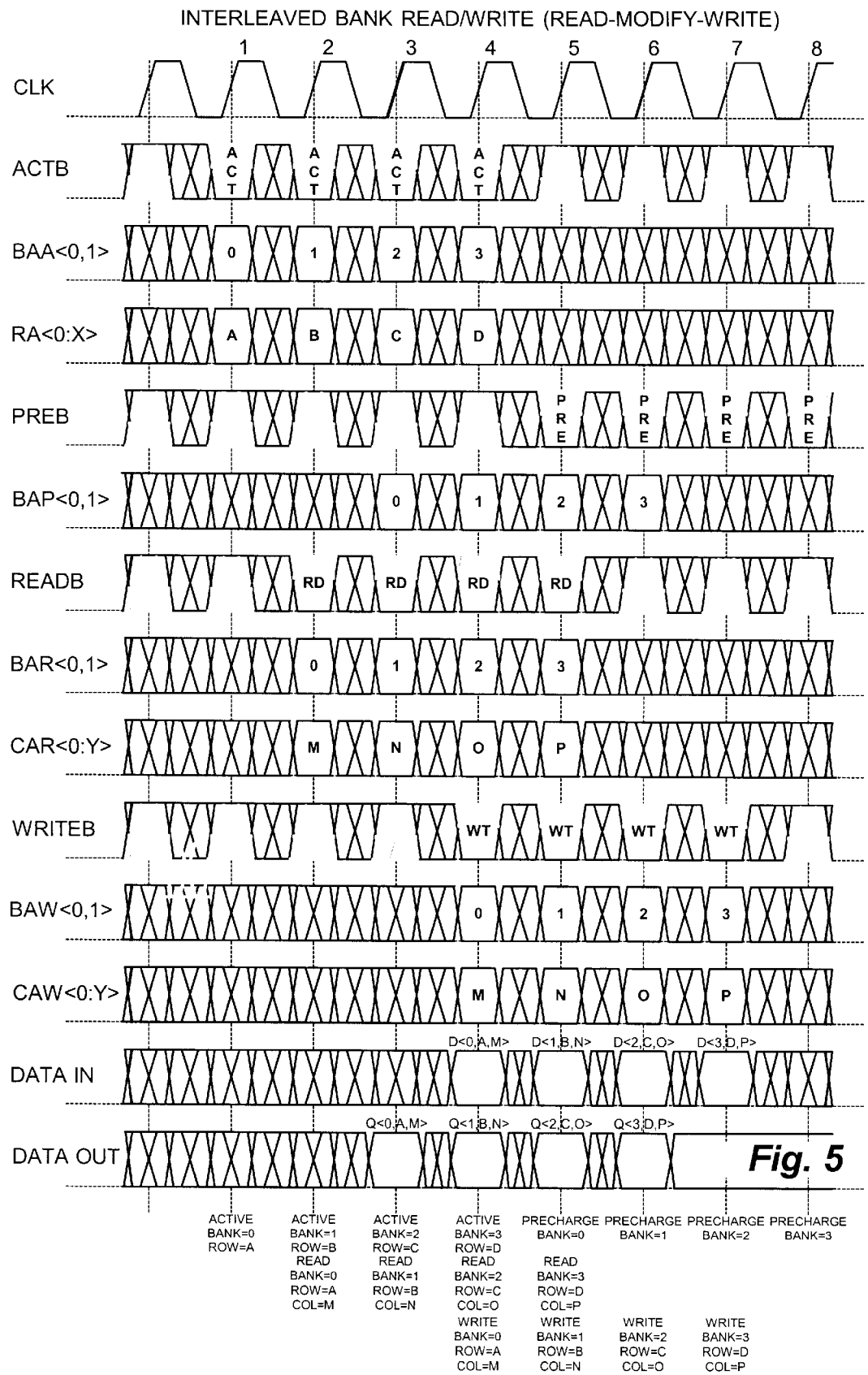
FIG. 5 is a representative timing diagram illustrative of the interrelationship among the various signals indicated in the exemplary embodiment of the present invention of the preceding figure including the bank address for active (or row select) commands ("BAA<0,1>"), bank address for "read" commands ("BAR<0,1>"), bank address for "write" commands ("BAW<0,1>") and bank address for precharge commands ("BAP<0,1>") and showing how each command can be simultaneously and independently executed during the same clock cycle thereby improving memory control bus utilization.

With reference additionally now to FIG. 5, a representative timing diagram is shown illustrative of the interrelationship among the various signals indicated in the exemplary embodiment of the device 50 of the preceding FIG. 4. The timing diagram presented represents how each command can be simultaneously and independently executed during the same clock cycle thereby improving memory control bus utilization over the conventional implementations shown with respect to FIGS. 1–3.

At CLK pulse 1, the ACTB command is asserted for bank 0, row A as shown. On the next CLK pulse 2, the ACTB is asserted for bank 1, row B while a concurrent READB command is issued for bank 0, row A, column M which bank and row were made "active" on the prior CLK pulse 1. At CLK pulse 3, the ACTB command is again asserted for bank 2, row C while a concurrent READB command issued for bank 1, row B, column N as this bank and row were made "active" on the preceding CLK pulse 2. Concurrently, data output ("Q") for bank 0, row A, column M is provided on the DATA OUT line 58.

At CLK pulse 4, the ACTB command is again asserted for bank 3, row D while a READB command is issued for bank 2, row C, column O. Data red from bank 1, row B, column N is also output on line 58 while a WRITEB command takes data from the DATA IN line 56 and writes it to bank 0, row A, column M, which bank, row and column were previously read from at CLK pulse 2. Subsequently, at CLK pulse 5, a PREB command is issued to precharge bank 0 while a READB command reads data from bank 3, row D, column P while data from bank 2, row C, column O is provided on the DATA OUT line 58. Concurrently, a WRITEB command takes data on the DATA IN line 56 and writes it to bank 1, row B, column N. Bank 1, row B, column N were previously read from on CLK pulse 3.

Bank 1 is next precharged at CLK pulse 6 while data is output from bank 3, row D, column P and data is written to bank 2, row C, column O which was read from at CLK pulse 4. At CLK pulse 7, bank 2 is precharged while data is written to bank 3, row D, column P which was previously read from at CLK pulse 5. At CLK pulse 8, bank 3 is precharged and the interleaved bank read/write operation is completed in only eight clock cycles as opposed to the thirteen of FIG. 3 or the sixteen of FIG. 2. This high level of parallel operation greatly improves memory control bus utilization.

While there have been described above the principles of the present invention in conjunction with specific address fields, including bank addresses for "read" and "write" commands and separate bank addresses for "active" and "precharge" commands, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a memory array comprising a plurality of memory banks, said memory array receiving a clock signal and a number of memory array command signals and being configured for reading data therefrom and writing data thereto; said memory array comprising:

a row address input for specifying a row address within said memory array;

at least one column address input for specifying a column address within said memory array;

a bank address read input for specifying one of said plurality of memory banks in said memory array from which data may be read at said specified row and column address; and a bank address write input for substantially concurrently specifying another one of said plurality of memory banks in said memory array to which data may be written at said specified row and column address.

2. The integrated circuit device of claim 1 wherein said at least one column address input comprises:

a column address write input for specifying a column write address within said memory array to which data may be written at said specified row and column write address in response to a write command signal; and a column address read input for specifying a column read address within said memory array from which data may be read at said specified row and column read address in response to a read command signal.

3. The integrated circuit device of claim 1 further comprising:

a bank address active input for directing activation of at least a portion of a designated one of said plurality of memory banks in response to an active command signal.

4. The integrated circuit device of claim 1 further comprising:

a bank address precharge input for directing precharge of a at least a portion of a designated one of said plurality of memory banks in response to a precharge command signal.

5. The integrated circuit device of claim 1 further comprising:

a data in input for receiving data to be written to said memory array; and a data out output for transferring data read from said memory array.

6. An integrated circuit device including a memory array comprising a plurality of memory banks, said integrated circuit device comprising:

a clock input for sequencing operations of said memory array;

a command input for receiving at least read, write, active and precharge commands for said memory array;

a row address input for specifying a row address within said memory array;

first and second column address inputs for specifying independent column addresses for respectively reading data from and writing data to said memory array; and a plurality of bank address inputs, each of said bank address inputs corresponding to one of said read, write, active and precharge commands.

7. The integrated circuit device of claim 6 wherein certain of said read, write, active and precharge commands may be asserted substantially independently.

8. The integrated circuit device of claim 6 wherein certain of said read, write, active and precharge commands may be asserted substantially concurrently.

9. The integrated circuit device of claim 6 wherein said first and second column address inputs may be asserted substantially concurrently.

10. The integrated circuit device of claim 6 wherein one of said plurality of memory banks may be made active in response to an active command while another of said plurality of memory banks may be read from substantially concurrently in response to a read command.

11. The integrated circuit device of claim 10 wherein a third of said memory banks may be written to substantially concurrently in response to a write command.

12. The integrated circuit device of claim 6 wherein one of said plurality of memory banks may be made active in response to an active command while another of said plurality of memory banks may be written to substantially concurrently in response to a write command.

13. The integrated circuit device of claim 12 wherein a third of said memory banks may be read from substantially concurrently in response to a read command.

14. The integrated circuit device of claim 6 wherein one of said plurality of memory banks may be precharged in response to a precharge command while another of said plurality of memory banks may be read from substantially concurrently in response to a read command.

15. The integrated circuit device of claim 14 wherein a third of said memory banks may be written to substantially concurrently in response to a write command.

16. The integrated circuit device of claim 6 wherein one of said plurality of memory banks may be precharged in response to a precharge command while another of said plurality of memory banks may be written to substantially concurrently in response to a write command.

17. The integrated circuit device of claim 16 wherein a third of said memory banks may be read from substantially concurrently in response to a read command.

18. A method for accessing data in an integrated circuit device including a memory array comprising a plurality of memory banks, said method comprising:

providing a row address input for specifying a row address within said memory array;

providing at least one column address input for specifying a column address within said memory array;

providing a bank address read input for specifying one of said plurality of memory banks in said memory array from which data may be read at said specified row and column address;

providing a bank address write input for substantially concurrently specifying another one of said plurality of memory banks in said memory array to which data may be written at said specified row and column address;

activating a first of said plurality of memory banks on a first clock cycle; and activating a second of said plurality of memory banks while substantially concurrently reading data from said first of said plurality of memory banks on a second clock cycle.

19. The method of claim 18 further comprising:

activating a third of said plurality of memory banks on a third clock cycle while substantially concurrently reading data from said second of said plurality of memory banks.

20. The method of claim 19 further comprising:

activating a fourth of said plurality of memory banks on a fourth clock cycle while substantially concurrently reading data from said third of said plurality of memory banks.

21. The method of claim 20 further comprising:

writing data to said first of said plurality of memory banks substantially concurrently with said activation of said fourth or said plurality of memory banks.

22. The method of claim 21 further comprising:

writing data to said second of said plurality of memory banks on a fifth clock cycle substantially concurrently with reading data from said fourth of said plurality of memory banks.

23. The method of claim 22 further comprising:

precharging said first of said plurality of memory banks substantially concurrently with said step of writing data to said second of said plurality of memory banks.

24. The method of claim 23 further comprising:

precharging said second of said plurality of memory banks on a sixth clock cycle substantially concurrently with writing data to said third of said plurality of memory banks.

25. The method of claim 24 further comprising:

precharging said third of said plurality of memory banks on a seventh clock cycle substantially concurrently with writing data to said fourth of said plurality of memory banks.

26. The method of claim 25 further comprising:

precharging said fourth of said plurality of memory banks on an eighth clock cycle.

* * * * *